United States Patent [19]

Giamei et al.

[11] Patent Number: 4,475,582
[45] Date of Patent: Oct. 9, 1984

[54] CASTING A METAL SINGLE CRYSTAL ARTICLE USING A SEED CRYSTAL AND A HELIX

[75] Inventors: Anthony F. Giamei, Middletown; Richard W. Salkeld, South Windsor; Neal P. Anderson, Broad Brook, all of Conn.

[73] Assignee: United Technologies Corporation, Hartford, Conn.

[21] Appl. No.: 343,084

[22] Filed: Jan. 27, 1982

[51] Int. Cl.³ .......................... B22C 9/04; B22D 25/00
[52] U.S. Cl. .................................. 164/122.2; 164/361
[58] Field of Search ................. 164/122.2, 125, 127, 164/361

[56] References Cited

U.S. PATENT DOCUMENTS

| | | | |
|---|---|---|---|
| 1,793,672 | 2/1931 | Bridgman | 164/122.2 X |
| 3,411,563 | 11/1968 | Fleck | 164/127 X |
| 3,494,709 | 2/1970 | Piearcey | 416/232 |
| 3,536,121 | 10/1970 | Piearcey | 164/122.2 |
| 3,542,120 | 11/1970 | Piearcey | 164/361 |
| 3,625,275 | 12/1971 | Copley et al. | 164/122.2 |
| 3,627,015 | 12/1971 | Giamei et al. | 164/361 X |
| 3,690,368 | 9/1972 | Copley et al. | 164/361 X |
| 3,763,926 | 10/1973 | Tschinkel et al. | 164/126 X |
| 3,857,436 | 12/1974 | Petrov et al. | 164/122.2 |
| 3,908,733 | 9/1975 | Brazer et al. | 164/361 X |
| 4,015,657 | 4/1977 | Petrov et al. | 164/122.2 X |
| 4,111,252 | 9/1978 | Day et al. | 164/122.2 X |
| 4,180,119 | 12/1979 | Burd et al. | 164/122.2 X |

FOREIGN PATENT DOCUMENTS 2949446  6/1980  Fed. Rep. of Germany ...... 164/127

*Primary Examiner*—Nicholas P. Godici
*Assistant Examiner*—J. Reed Batten, Jr.
*Attorney, Agent, or Firm*—C. G. Nessler

[57] ABSTRACT

A method of epitaxially casting single crystal metal articles in molds, which comprises causing the solidification interface velocity vector to rotate through at least 90 degrees, preferably 180-540 degrees, about the axis of overall directional solidification growth. In addition, a mold section has a small passageway configured to prevent line of sight communication between the portion where the seed is contained and the article portion of the mold. Preferably, the passageway is shaped like a helix of 0.8-1.5 turns. A second seed can be formed in the mold of an article made from a first seed, and used to make a second casting. The invention reduces the normal increase in crystallographic variability which would otherwise be associated with such practice.

11 Claims, 14 Drawing Figures

FIG. 8
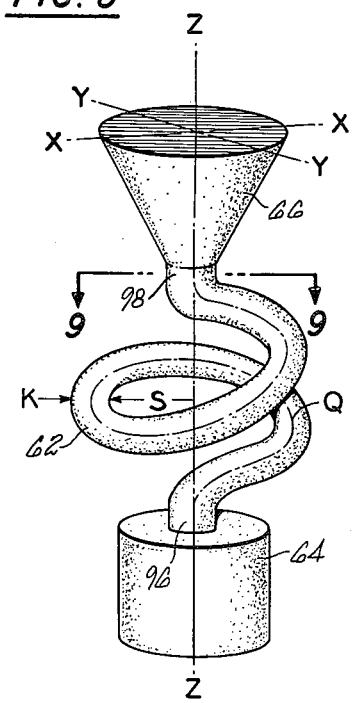
FIG. 9
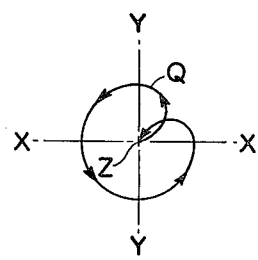
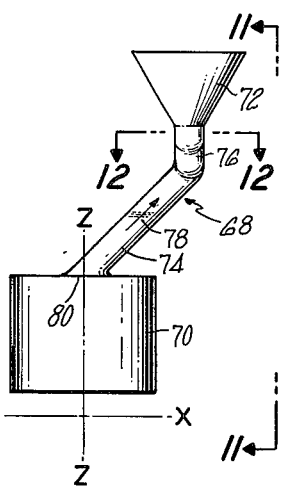
FIG. 10
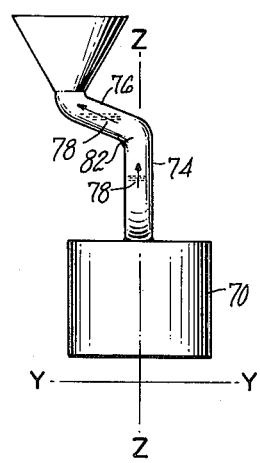
FIG. 11

CASTING A METAL SINGLE CRYSTAL ARTICLE USING A SEED CRYSTAL AND A HELIX

TECHNICAL FIELD

The present invention relates to the field of casting, more particularly to the directional solidification of single crystal structures.

BACKGROUND

Directional solidification is a method of casting using controlled cooling to cause a solidification interface to move progressively through a mold filled with molten metal. In the highest technology embodiment of this process, single crystal articles are cast. There are several ways in which single crystal castings in useful shapes can be formed. Common to all of them is that a solidification front having the desired crystal structure must be initiated within the molten metal of the casting. Sometimes very small and confined points of the mold are used, such as shown in U.S. Pat. No. 1,793,672 to Bridgman and Pat. No. 4,015,657 to Petrov et al. When a multiplicity of grains grow as adjacent columns, there is a progressive crowding out of certain grains with movement of the solidification front along the length of the casting. Thus, if the mold diameter is small enough and length great enough, eventually only a few grains, or a single grain, will remain. In U.S. Pat. Nos. 3,494,709 and 3,536,121 to Piearcey, an improved method is shown wherein a zig-zag passage in a mold causes the rapid selection of a single grain from a multiplicity of columnar grains. In a more refined practice, a helix shape is used, as shown in U.S. Pat. No. 4,111,252 to Day et al., it is this which has been widely used in commerce. However, in the methods referred to above there is no way to control the secondary orientation (orientation of the crystal within the x-y plane when growth is along the z axis). Additionally, the only grain orientation which will lie along the z axis direction of growth is that which nature preferentially selects, e.g., >001< in the case of a face centered cubic nickel superalloy.

Therefore, seed crystals are often used to initiate solidification fronts, to control crystal orientation and simplify mold construction. Typically, a seed crystal is placed at the base of the mold where it can be cooled. Molten metal poured into the mold contacts the seed, partially melting it. Thereafter, epitaxial solidification from the seed is caused to take place. The use of seed crystals is well known, as is shown by U.S. Pat. Nos. 3,763,926 to Tschinkel et al. and 3,857,436 to Petrov et al. In many instances solidification from seed crystals is preferred, and the present application is concerned with castings which are so made. Generally, the use of seeds has meant that there is no need for a zig zag or helix section. In some circumstances a narrowing of the mold above the seed crystal has been required. For example, in the co-pending application of U.S. Ser. No. 250,521 of Terklesen, filed Apr. 2, 1981, a specially shaped mold eases the difficulty of melting the seed crystal sufficiently to enable epitaxial solidification. Surplus molten metal is flowed across the seed crystal and thereafter surrounds it. Thus, there will be extraneous nucleation around the periphery of the seed crystal; it is Terklesen's practice to place a restriction in the mold above the seed crystal. In essence, the cross sectional area of the propagating solidification front is reduced to an area which is smaller than the cross section of the seed placed directly below the restriction. This stops vertical propagation into the article cavity of non-epitaxial crystal growth.

The foregoing techniques are effective in obtaining single crystal castings which are useful in commerce. As used herein, the term "single crystal casting" is a term of art and is not a rigid scientific term. Single crystal castings are functionally characterized by measuring the properties of the castings, and they may not have perfectly uniform crystal structure. Variations in crystallographic orientation are permissable when they do not substantially degrade mechanical properties below those of an ideally uniform crystal casting. See the co-pending U.S. Ser. No. 333,600 of Giamei, filed Dec. 23, 1981, the disclosure of which is hereby incorporated by reference. In the Giamei invention, a single crystal casting is formed by simultaneous solidification from two spaced apart seeds. As Giamei discloses, even in castings which are made from a single seed, it will be found that there is a progressive degradation in the crystallographic quality as a solidification front moves along the casting. Accordingly, a point in a casting which is distant from the seed crystal will be found to have more variation in crystal structure than will a location close to the seed. Points at the periphery of the casting at the distant location can significantly diverge in orientation from the nominal orientation of the casting. This phenomenon and its significance has only recently been appreciated, after continuing research and development.

Normally, divergence in crystal structure does not present a problem except in castings with large lateral dimensions. And such problems can be overcome by the aforementioned Giamei invention. But it is still desired to make more nearly ideal castings in general.

There is a further problem which involves the making of seeds. In some instances, it is possible to remove the original seed crystal from a just-made casting, and reuse it for another casting. But, more often the seed is difficult to retrieve for mechanical reasons, or it is unacceptably melted and merged with the casting. Thus seeds have been more effectively made as independent castings, followed by machining. But such a procedure is costly and improved techniques are desired.

DISCLOSURE OF INVENTION

According to the invention, a mold which contains molten metal has a specially shaped constriction, or selector section, interposed between the portion where the seed is contained and the portion where a single crystal article is formed. The selector section is shaped to cause the velocity vector of the solidification interface or front to rotate at least 90 degrees in the x-y plane, preferably more than 180 degrees, as it moves along the z axis through the section. Preferably, this is accomplished by a selector section shaped as a helix of about 0.8–1.5 turns, thus causing the velocity vector to rotate about 290–540 degrees. Zigzag and other inclined passageways are also usable.

It is found that suitable rotation of the velocity vector leads to substantially decreased variability in the crystal structure. For example, using a helix, a seed with a ±3 degree variation in crystal structure will be able to produce an article with variation of ±0.8 degrees at the base, and ±1 degree at the top. This is compared to values of ±2 and ±3.5 degrees respectively when a straight constriction is used.

Thus, with the use of a preferred helix passage in a mold, a second seed may be feasibly made at the top of an article casting made from a first seed. The second seed can then be used in the making of a second article having a variation in crystal structure which is more acceptable than is the case in the absence of the helix. As a result the quality of single crystal articles is improved and costs of manufacture are reduced.

The foregoing and other objects, features and advantages of the present invention will become more apparent from the following description of preferred embodiments and accompanying drawings.

BRIEF DESCRIPTION OF DRAWINGS

FIG. 8 shows a seed and a portion of the metal casting grown from it, through a mold helix, and into the bottom of an article cavity.

FIG. 9 is a projection of the helix centerline Q into the x-y plane as viewed from line 9—9 in FIG. 8.

FIGS. 10-12 are various views of the seed and metal casting in the vicinity of the selector section, to illustrate the manner in which a solidification interface velocity vector rotates in connected straight portions of a 90° turn passageway.

FIG. 11 shows the structure of FIG. 10 as viewed from line 11—11.

FIG. 12 is a sectional view taken along line 12—12 in FIG. 10.

FIG. 14 shows the structure of FIG. 13 as viewed from line 14—14.

BEST MODE FOR CARRYING OUT THE INVENTION

The invention is described in terms of the casting of a single crystal article made from a nickel superalloy by solidifying molten metal in a ceramic shell mold. Nonetheless, it will be apparent that the invention will be applicable to different variations of directional solidification and to other metals.

A face centered cubic crystal structure nickel superalloy, such as is disclosed in U.S. Pat. Nos. 4,116,723 and 4,209,348 to Duhl et al., is melted and introduced into a refractory ceramic shell mold, such as one made of predominantly zircon. The mold is contained within a furnace at a temperature above the melting point of the metal and rests on a cold chill plate. The furnace, mold, and chill plate apparatus is adapted to cause progressive solidification of the metal in the casting. See U.S. Pat. Nos. 3,494,709, 3,542,120, 3,915,761, and 4,190,094 for the general methodology of directional solidification. A seed is contained within the base of the mold which is in contact with the chill plate. The seed melt-back is controlled, as described in U.S. Pat. No. 4,412,577.

To reduce seed manufacturing costs, it was early thought to be a desirable practice to position a seed shaped cavity at the top of a mold, so that contemporaneously with the forming of a desired cast article, a new seed is manufactured for an additional casting. During the use of such a procedure, progressive degeneration in casting yields was observed. Casting yield is defined according to the percentage of solidified articles which are found to meet the crystallographic criteria for a single crystal part. As an example of the criteria, a turbine blade article in accord with the Piearcey U.S. Pat. No. 3,494,709 will have the [001] crystal axis aligned within 20° of the longitudinal z axis. Even closer alignment may be specified. As a further example, the Giamei application Ser. No. 333,600 suggests that the variation in crystal orientation within a casting ought to be kept below certain levels. The principal problem observed in successive seed generation and casting is in misalignment of the primary or mean orientation of the crystal. However, the variability in crystal orientation, presented as a "±" value, was also a significant problem; it increased greatly in successive castings, and locally increased the deviation from the desired crystal orientation. To improve success in seed generation and in any particular casting, crystal variations were investigated and improvements were evaluated.

Figure 1:
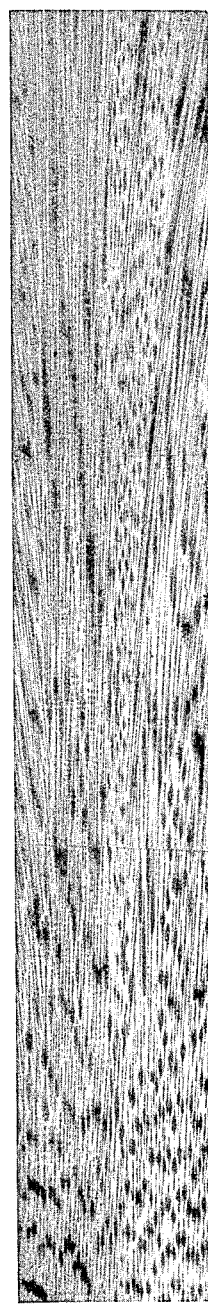
FIG. 1 is a macrophotograph of a cast nickel superalloy bar which has been etched to show microstructure.

FIG. 1 is a macrophotograph of a 1.2 cm diameter by 20 cm long rod 20 which was cast as a single crystal by causing a solidification interface to move along the z axis to cause the [001] crystal axis to lie parallel to the z axis. The bar has been sectioned along its z axis and etched to reveal its microstructure. That which is revealed by etching is actually a light colored dendritic growth structure, within a dark colored matrix. The crystallographic orientation is only directly measurable by means of techniques which ascertain the location of atomic planes, such as x-ray diffraction according to the Laue method. However, the dendritic orientation is reflective of the crystallographic orientation. In the nickel superalloy of the bar (being the inventive alloy of U.S. Pat. No. 4,116,723), dendritic growth preferentially occurs along the [001] axis. Thus, the crystallographic orientation is suggested by the orientation of the dendrites. From the Figure it is seen that the base 22 of the bar, where solidification first took place, has a structure which is generally aligned with the z axis. At the top 24 of the casting, the last portion to solidify, it is seen that the crystal structure is less regular. At the left and right sides of the top it is seen that the crystal structure is divergent in opposing directions from the z axis. In addition, it appears that the mean orientation is not aligned with the z axis.

Figure 2:
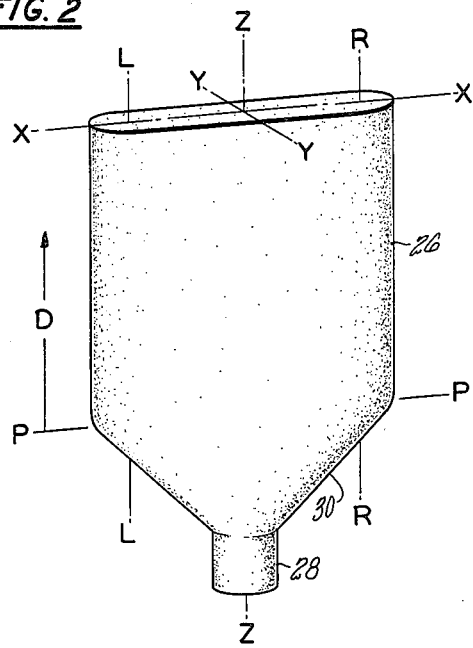
FIG. 2 shows a cast oblong bar with the seed from which it was solidified; the transition section between the article and the seed are still attached.

FIG. 2 shows the shape of a nickel alloy slab article 26 which was epitaxially solidified from a seed. The seed 28 and transition section 30 are still attached. Epitaxial crystal growth of [001] was initiated at the seed 28 and caused to progress vertically upward along the z axis, expanding laterally in the transition section 30 until it reached a plane corresponding with the line P—P, then continuing upwardly through the body of the bar 26. The crystal orientation was measured at various distances D from the datum reference plane at P—P, for three lateral locations within the bar, represented by the lines L—L, Z—Z and R—R. The distance between the lines L and R was about 3.8 cm and the length of the bar above the datum P—P was somewhat greater than 10 cm.

Figure 3:
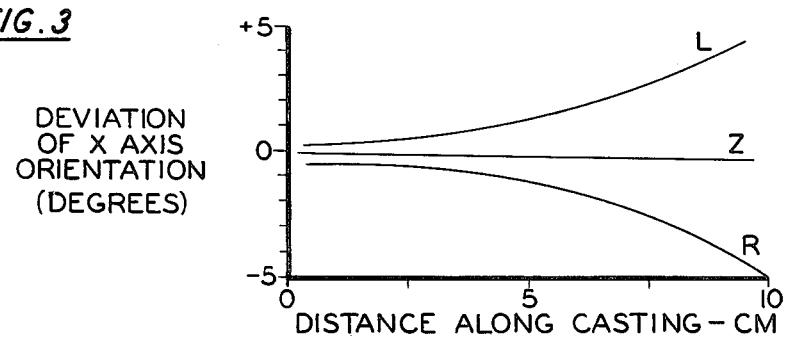
FIGS. 3 and 4 show the variation in crystallographic orientation along the length of the bar shown in FIG. 2.
Figure 4:
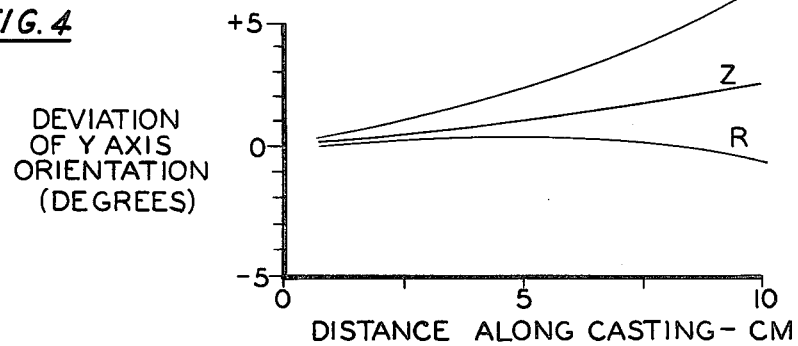

FIGS. 3 and 4 indicate the mean crystallographic orientation, as it deviated in degrees from perfect alignment with the x or y axes which are shown in FIG. 2. FIG. 3 illustrates how, at the Z location, the [001] crystal orientation is substantially aligned with the x axis all along the bar. But, it is seen at the L and R locations there is a divergence in the mean orientation of the [001] crystal axis from parallelism with the x axis. Similarly, FIG. 4 shows a divergence of the [001] crystallographic axis in the y axis direction. However, in this instance it is seen that the L location is characterized by more divergence than the R location, and there is some deviation as well at the Z location. Additional data on progressive divergence is given in the aforementioned application Ser. No. 333,600.

The exact physics underlying the observed increasing variation in crystal structure along the length of a casting are not fully understood. The solidification interface which moves through the casting is generally non-planar and this has undoubtedly some influence. Probably there are small changes in interface shape and velocity along the length of a casting. Further, the thermal gradient may not be exactly co-aligned with the z axis of a part.

Figure 5:
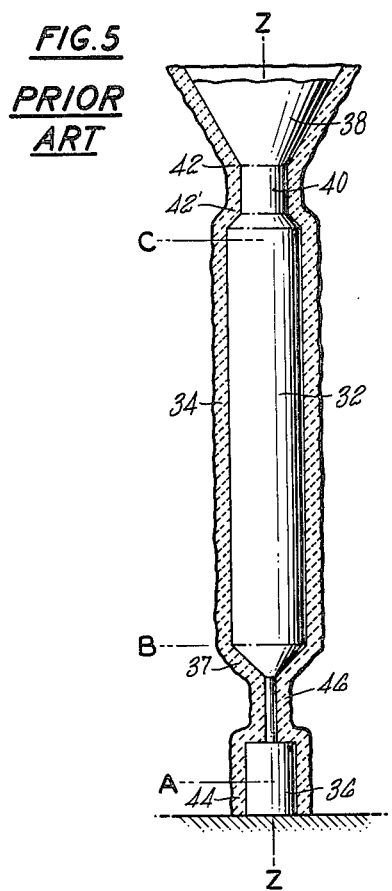
FIG. 5 shows a solidified casting with the mold partially removed; the mold shaped to cause the solidification front to move from a seed through a straight cylinder selector section, and into the article cavity.

FIG. 5 shows another cast bar article 32 as it appears after solidification, with the ceramic mold 34 cut partially away and the seed 36 and gating 38 still attached. Attached to the uppermost end of the article 32 is a second seed 40 which was formed when the solidification interface exited from the article part of the mold and progressed toward the gating part of the mold. The second seed 40 will be separated from the article and gating by cutting along planes at locations 42,42' to permit its use in making another casting. It is undesirable to use the original seed 36 because the seed may have associated with it extraneous grains, created during the casting process. See U.S. Pat. No. 4,412,577 referred to above. Directly above the starter section 44 of the mold, where the first seed 36 is contained, is the selector section 46 of the mold. This is a cylindrical shaped passage which is centrally located above the first seed 36.

Figure 6:
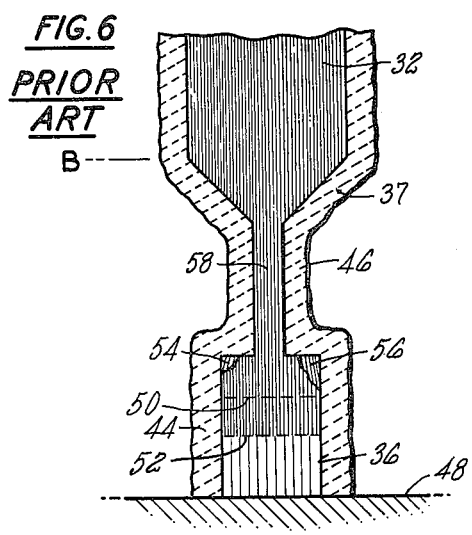
FIG. 6 is a detail view of the lower portion of FIG. 5.

FIG. 6 shows in more detail the function of the cylindrical selector section. The first seed 36 rests on the chill plate 48 and is thereby cooled. Prior to casting the seed had a length along the vertical z axis which is indicated by the phantom line 50. In the directional solidification process, the mold is heated to an elevated temperature and molten metal at a superheated temperature is introduced into the mold. This causes melting back of the seed to a location indicated by the phantom line 52. Thereafter, the molten metal was caused to solidify epitaxially from the unmelted portion of the seed, to form the article 32. However, in carrying out this process it is not uncommon that there will be nucleation of new grains, particularly at points around the periphery of the seed and at the ceramic walls of the starter section 44 of the mold. In the Figure, such deviant crystal growth is indicated by the regions 54,56. Just as the molten metal resting on the central part of the seed is caused to solidify epitaxially, the extraneously nucleated grains will cause the localized epitaxial crystals 54, 56. From the Figure, it can be seen that only a solidification front which creates a structure corresponding with the central part of the seed, generally directly below the cylindrical channel 58, will be permitted to enter into the article cavity 32, as the front moves along the z axis. The crystal structure which will be obtained in the article 32 is generally ascertainable by measuring the quality of the crystallographic growth at a plane indicated by the line B, just at the exit of the transition section 37, and at the base of the article.

Figure 7:
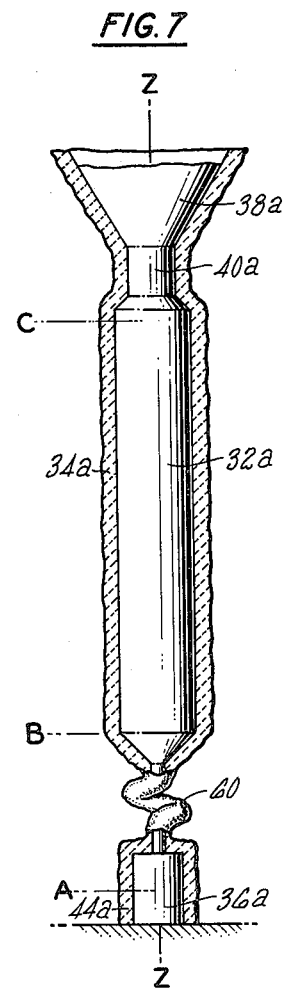
FIG. 7 is similar to FIG. 5, but shows the use of a helical shaped selector section between the seed and the article, in accord with the invention.

In experimental tests, the crystal structure has been measured at the planar locations indicated by the lines A, B and C in FIG. 5. FIG. 7 corresponds with FIG. 5 and shows the invention, wherein a helical selector section 60 is used, instead of a cylindrical selector section. (The other numbers designating the various elements shown in FIG. 7 correspond with those of FIG. 5, except for the suffix letters.)

The data shown in Table 1 illustrate the utility of the invention; presented in simplified fashion is the distillation of a relatively large amount of data. The data in the Table are representative of cast bars which are about 2.5 cm in diameter and about 10–12 cm long, made from seeds of about 1.2 cm diameter, in molds of the FIG. 5 or 7 configurations. The data in columns E and G reflect actual measurements, while the data in columns F and H are calculated, but correspond with actual experience. The [001] crystallographic orientation, measured in x and y directions with respect to the z axis, has been geometrically combined and normalized. Each datum indicates the mean orientation corresponding with a particular plane at locations A, B or C; the number after "±" indicates the variation from the mean which the crystallographic structure has across the plane. Column E indicates orientation observed in a casting made in a mold having the configuration shown in FIG. 5. It is seen that the crystal structure at plane B actually has reduced variability, compared to the seed, even though greater variation might have been expected. This result can be attributed to the fact that the selector section does not cause propagation into the bottom of the article cavity of the crystallographic variations which the seed had across the entire plane 52. The constriction has allowed propagation of only the narrower range of variation from the seed center. Column E shows that at plane C, the top of the article, there has been a deviation both in the mean orientation and an increase in the variability, compared to that which was present at either planes A or B.

TABLE 1

| | Crystallographic Orientation Obtained in Various Castings | | | |
| --- | --- | --- | --- | --- |
| | Normalized Orientation in Degrees for Mold-Seed Combination | | | |
| Casting Location | E | F | G | H |
| A. Seed | 0 ± 3 | 2.6 ± 3.5 | 0 ± 3 | 1.3 ± 1 |
| B. Article Bottom | 0 ± 2 | 2.6 ± 2.5 | 0 ± 0.8 | 1.3 ± 0.8 |
| C. Article Top | 2.6 ± 3.5 | ~5 ± 4 | 1.3 ± 1 | 3 ± 1 |

Legend:
E - Casting from FIG. 5 mold
F - Casting from FIG. 5 mold, using second seed from Column E
G - Casting from FIG. 7 mold
H - Casting from FIG. 7 mold using second seed from Column G Column F shows what happens when a "second seed" is used to make a casting, where the second seed 40 is formed in a casting for which the column E data is representative. The seed essentially has the plane C crystal structure, and is misoriented by 2.6 degrees. When the FIG. 5 configuration is used, it is again seen that the variability is reduced at plane B. But, of course, the mean primary misorientation of 2.6 degrees is not changed. At plane C it is seen that the misorientation will be further increased to the range of 5°; the variability will be further increased as well. The data are not shown, but if a still further casting were made from the second seed of the column F casting, there would be an even greater degree of degradation in the mean orientation. It appears that the rate of degradation increases geometrically according to the degradation which is present. Consequently, it can be seen why the techniques of the prior art are unsuited for making a second seed simultaneously with the casting of an article from a first seed. This has necessitated the making of the seeds separately, or the undesirable reuse of first seeds.

Column G in Table 1 indicates data for a casting made using the configuration of FIG. 7, in accord with the invention. The seed has the same initial orientation and variation as the seed used for the column E casting. But, there is seen to be a much more substantial improvement in the quality of the casting at the article bottom, plane B. The primary orientation is unchanged from zero, but the variability has been reduced from $\pm 3°$ to about $\pm 0.8°$. At location C, there has been some typical degradation in the primary orientation, to 1.3°, while the variability has increased to $\pm 1°$. Nonetheless, this result compared very favorably with the $\pm 3.5°$ variation which was encountered when using the cylindrical shaped selector. It is also noted that there is less degradation in the base orientation of the crystal, namely only 1.3° versus 2.6°. Accordingly, the second seed removed from the column F casting will be useful in making an additional casting.

Column H shows data reflecting this use. Again, it is seen that at plane B the variability is reduced while the mean orientation is unchanged. At plane C there has been degradation in both the mean orientation and variability. However, the results are considerably better than those reflected in column F.

According to the experience thus far, there will always be a progressive degradation in crystallographic quality. Thus, even with the invention, the "second seed" can only be successively created a certain number of times. Reasonable experiment will determine this limit, according to the limiting crystallographic orientation.

The key to the invention is the use of a mold selector section which functions like a helix, to substantially reduce crystal variability. Previously, it was known that a helix was useful in converting columnar grain growth into single crystal grain growth. See the aforementioned patents to Piearcey and U.S. Pat. Nos. 3,625,275 and 3,690,368 to Copley et al. and 3,627,015 to Giamei et al., having common assignee herewith, the disclosures of which are hereby incorporated by reference. A "zig-zag" ramp-like configuration has been used. See U.S. Pat No. 3,536,121 to Piearcey. Generally, these prior art configurations may be used in the present invention with a seed. The preferred helix shape in the present invention comprises a circular cross section and at least one turn of rotation about the longitudinal z axis. Essentially, the helix is a curved tube.

From experiments with nickel superalloy casting, we have found that there is an optimum configuration for the helix. FIG. 8 shows in more detail a helical passage 62 which connects the starter cavity 64 with the transition section 66 and article section, just above the transition section. Preferably the passage diameter K is about 5 mm and the helical radius S is about 6 mm, somewhat different proportions than suggested by FIG. 8. The helix should have a pitch which is sufficient to maintain z axis movement of the solidification front, to avoid extraneous nucleation which might be associated with too low an effective thermal gradient along the length of the helix passage. Preferably the pitch P (measured in the same manner as a screw thread pitch) is about 2 cm, and the helix comprises about 1-1.5 turns. As the discussion hereinafter indicates, fewer turns are permissable; generally, we consider about 0.8 turns to be the practical minimum. A greater number of turns may be used; e.g., two turns are usable. However, greater turns are associated with greater overall length of the helix, and this is disadvantageous because it increases the height of the total casting.

FIG. 9 is a view along the z axis of the center line Q of the helical passage shown in FIG. 8. For the helix shown in FIG. 8, it can be seen that the passage rotates about 450° around the z axis, representing about 1.25 turns. Stated alternatively, the direction of the passage shifts continuously in direction in the x-y plane.

To carry out the objects of the invention other selector section shapes may be used when they function similarly to the helix. Essentially, a passageway narrow in cross section compared to the lateral dimension of the article is preferred. A primary requirement of the selector section passageway is that there be no direct z or other axis growth between the starter cavity and the article cavity. A selector section useful in the invention must cause the solidification interface to translate laterally; this is preferably done by causing rotational motion about the z axis.

Figure 12:
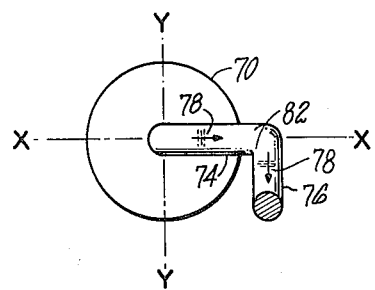

The helix is the best embodiment of the invention. Obviously, the helix can be replaced by a series of interconnected short, straight passageways. The continuous helical curve is preferred because corners and sharp turns tend to promote extraneous nucleation. To help understand the function of the helix, the general mode, and limits of the invention, simplified straight passageway selector sections are shown in FIGS. 10-14. FIGS. 10-12 show a passageway 68 which connects a starter cavity 70 with a transition section 72. The selector section passageway 68 is comprised of two straight portions 74, 76. Passageway portion 74 has its upper end laterally displaced from its lower end, with respect to the z axis. Similarly, portion 76 also has its upper end laterally displaced from its lower end. The motion of the solidification interface or front through the portion 74 is represented by the symbol 78, where the arrow corresponds with the mean motion and the short lines represent the interface as it appears during passage. Generally, the solidification interface will be in conformance with the thermal isotherms, and parallel to the x-y plane. (The thermal gradient in any portion of a passageway may be perturbed by various factors beyond the scope of the present discussion. Therefore, the representation herein of the interface disposition in space is an assumption which is believed to be substantially accurate.) When the solidification interface reaches the upper end of the portion 74 it must move further with a component at a 90° angle to its previous direction, as is evident from FIGS. 11 and 12, when it enters the portion 76. The function of the two portions 74, 76 of the passage can be understood as follows. As FIG. 10 shows, the extension of the portion 74 to the right, along the x axis, means that the crystal structure only from the right hand side of the epitaxial growth which starts at the passage entrance 80 can be propagated in portion 74. Likewise, as FIG. 11 shows, the location of the entrance 82 of the portion 76 at the left hand side of the portion 74 means that only the crystal structure which is on the left hand side of the portion 74 can be propagated into the portion 76. It is this selection of relatively small samples of the epitaxial crystal growth front which leads to the reduced variability. The helix achieves the same object but on a gradual basis rather than at a discrete point.

Figure 13:
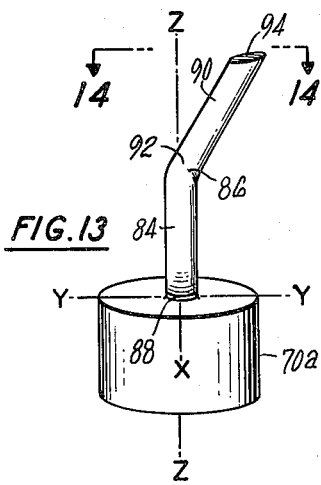
FIGS. 13 and 14 illustrate a passageway similar to that of FIGS. 8-10 but having a less than 90°passageway turn.
Figure 14:
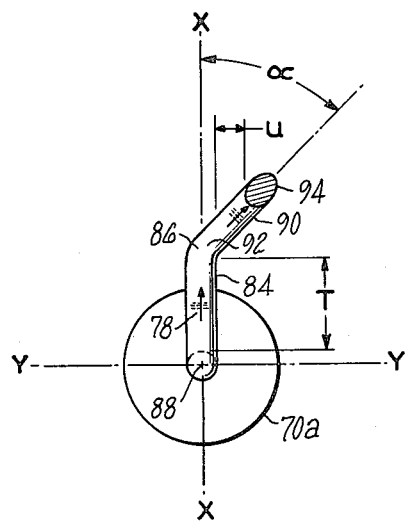

FIGS. 13 and 14 show another passageway configuration which will carry out the invention and helps illustrate the limiting general mode. The passage configuration is not very practical but serves to illustrate the limits of the invention. The Figure 14 view is analogous to the FIG. 12 view. The first portion 84 of the passageway attached to seed 70a is similar to the just-described portion 74 and has it upper end exit 86 displaced a distance T from the lower end entrance 88 along the x axis. Second portion 90 of the passageway is connected to the portion 84, at an angle α to the x axis. The entrance 92 to the portion 90 is connected at the side of the portion 84. The exit 94 of the portion 90 is vertically displaced along the z axis and is laterally displaced along the y axis a distance u from the entrance. In the passageway comprised of portions 84,90 direct line of sight communication is prevented between the entrance 88 and the exit 94. This limitation is necessary in the practice of the invention. As will be appreciated with thought, the angle α may be varied, with lesser angles requiring greater lengths of the portion 90, to ensure that there is no line of sight communication along an axis between the entrance and exit. (Of course, the portion 90 is also inclined upwardly with respect to the x-y plane and it is the resolved angle, not α which is controlling, but the illustration is given for simplicity.)

Therefore, to generalize, the selector section passage must have at least a first portion with its ends lying along the y axis and a second portion with its ends lying along the y axis; the entrance and the exit of the combined portions may have no direct line of sight communication. Essentially, the shape of the passageway must be that which causes a solidification interface (having its primary motion along the z axis), to undertake motion in a first x axis direction, transverse to the z axis, and to thereafter undertake motion in a second direction having a component at least 90° to the first direction, as measured in the x-y plane, prior to entering into the article cavity. Alternatively stated, the projection into the x-y plane of the passageway shape must be such that the velocity vector rotates by at least 90° as the solidification interface passes through the selector section. Practically speaking, it is most desirable to have the motion vector rotate by a further 90° component, so that the exit component is at least 180° of rotation from the direction of the first component. As indicated above for the 1-1.5 turn helix, and for any passageway, it is even more preferred that the rotation be in the range 360-540°. The increased degree of rotation makes less critical any analysis with respect to the line of sight connection between the entrance and exit ports of the passage and assures the improved crystal structure.

At various points, and in the drawing, we have described the transition section at the base of the article section. For practically all articles of interest the passageway opening is smaller than the article cross section, thus necessitating the transition section. Occasionally the article will be shaped to inherently have a transition section. The transition section has no advantageous effect on crystal structure, in the context of the discussion herein. The only effect observed therein will be a slight degradation in crystal structure, corresponding with vertical and lateral crystal growth. Thus, any reference herein to the relationship of the passageway or selector section to the transition section can be taken to refer as well to the relationship to the article section, as is done in the claims.

In the best practice of the invention, when using a helix, a straight section 96, as shown in FIG. 8, should be provided between the starter cavity and the actual helix. This reduces the lateral dimension of the opening at the top of the starter cavity, and thus desirably selects a smaller portion of the epitaxial solidification front emanating from the seed. Also, it is generally found desirable and practical to have an additional straight section 98 at the top of the selector section, to transition from the helix to the article cavity. Of course, other contours in the selector section passageway may be used in combination with a helix or the like, so long as the objects set forth herein for the selector section are achieved.

We have referred above to the seed being a single crystal, to make a single crystal part. This is certainly preferred, but a seed which is not entirely single crystal may be used in the invention. It is only required that the seed have the desired crystallographic structure at the upper surface from which epitaxial solidification into the passage emanates. Lack of single crystal structure located in regions of the seed which do not interfere with the epitaxial growth which enters the selector section passage can be contemplated.

One of the best uses of the invention is in the making of a second seed, as described. We prefer to locate the second seed at the top of the article cavity, to reduce the width of the casting and increase furnace capacity. However, in other embodiments, the seed could be formed in a different position in the mold, with respect to the article section, provided the second seed cavity receives growth emanating from the selector section.

Although this invention has been shown and described with respect to a preferred embodiment, it will be understood by those skilled in the art that various changes in form and detail thereof may be made without departing from the spirit and scope of the claimed invention.

We claim:

1. The method of casting a single crystal article using a mold filled with molten metal, a seed crystal and movement of a solidification interface along an axis of the mold, wherein the mold has an article section for forming the article and a starter section for holding a seed, the sections lying along the mold axis, characterized by rotating the solidification interface velocity vector at least 90 degrees about the mold axis, as the solidification interface moves from the starter section to the article section, the rotation measured as the vector is projected into a plane perpendicular to the mold axis.

2. The method of claim 1 wherein the rotation of the velocity vector is at least 180 degrees, and is caused by passing the solidification interface through a passageway connecting the starter section and the article section.

3. The method of claim 2 wherein the solidification interface movement is characterized by a helical motion of 0.8-1.5 turns.

4. The method of claims 2 or 3 wherein the path of solidification interface motion between the starter section and article section is characterized by an absence of line of sight between the starter section and the article section.

5. The method of claim 1 characterized by making a casting which comprises the article and a second seed, the second seed having essential epitaxy with the first seed contained in the starter section; separating the second seed from the article after solidification; and using the second seed to cast a second article.

6. The method of claim 5 characterized by a face centered cubic superalloy metal, a ceramic mold, and aligning the seed so that an [001] crystal axis lies within ±20° of the mold axis.

7. Apparatus for directional solidification of a single crystal article by epitaxial growth from a seed crystal which comprises a mold having a starter section containing a seed crystal and an article section, characterized by a selector section lying along an axis connecting the article section and the starter section, the selector section having a passageway with opposing end openings into the article and starter sections, the passageway preventing line of sight between the openings and having a rotation in space of at least 90 degrees as measured by the passageway projection into a plane perpendicular to the axis.

8. The apparatus of claim 7 characterized by a helix shaped passage, the helix having at least about 0.8 turns to provide a rotation in space of at least about 290 degrees.

9. The apparatus of claim 8 characterized by a straight section of passageway connected at the starter section end of the helix shaped passageway.

10. The apparatus of claim 9 characterized by a straight section of passageway connected at the article section end of the helix shaped passageway.

11. The apparatus of claim 7 characterized by a seed composed of a face centered cubic alloy; a refractory ceramic mold; and a selector section passageway shaped as a helix having 1–1.5 turns.

* * * * *